(12) United States Patent
Yoshizawa

(10) Patent No.: US 6,187,101 B1
(45) Date of Patent: Feb. 13, 2001

(54) SUBSTRATE PROCESSING DEVICE

(75) Inventor: Takashi Yoshizawa, Nara (JP)

(73) Assignee: Sharp Kabushiki Kaisha, Osaka (JP)

( * ) Notice: Under 35 U.S.C. 154(b), the term of this patent shall be extended for 0 days.

(21) Appl. No.: 09/318,090

(22) Filed: May 25, 1999

(30) Foreign Application Priority Data

May 25, 1998 (JP) .................................................. 10-142411

(51) Int. Cl.⁷ .................................................. C23C 16/00
(52) U.S. Cl. .......................................... 118/718; 118/715
(58) Field of Search .................... 118/718, 715, 118/723 R, 729, 723 E

(56) References Cited

U.S. PATENT DOCUMENTS

| 4,430,749 | * | 2/1984 | Berkman | 156/613 |
| 5,090,356 | * | 2/1992 | Nath et al. | 118/718 |
| 5,372,646 | * | 12/1994 | Foote et al. | 118/719 |
| 5,413,671 | * | 5/1995 | Ketchum | 216/37 |
| 5,688,359 | * | 11/1997 | Martin | 156/345 |
| 5,863,338 | * | 1/1999 | Yamada et al. | 118/719 |
| 5,976,258 | * | 11/1999 | Kleiner | 118/718 |
| 6,056,824 | * | 5/2000 | Bartholomew et al. | 118/719 |

FOREIGN PATENT DOCUMENTS 8-279498   10/1996   (JP) .

* cited by examiner

*Primary Examiner*—Jeffrie R. Lund
*Assistant Examiner*—Sylvia R. MacArthur
(74) *Attorney, Agent, or Firm*—Dike, Bronstein, Roberts & Cushman, LLP; David G. Conlin; George W. Hartnell, III

(57) ABSTRACT

A substrate processing device of the present invention includes: a conveyor mechanism provided in a vacuum chamber for conveying a substrate thereon; a heating section provided within the vacuum chamber for heating the substrate; and a processing gas introduction section for introducing a processing gas to a processing zone within the vacuum chamber. A surface of the substrate is consecutively subjected to a predetermined process by: introducing a flow of the processing gas from the processing gas introduction section into the processing zone; conveying the substrate into and past the processing zone by means of the conveyor mechanism while heating the substrate by means of the heating section. The substrate processing device further includes an inert gas supplying section provided in the vacuum chamber for supplying an inert gas for controlling the flow of the processing gas.

8 Claims, 7 Drawing Sheets

SUBSTRATE PROCESSING DEVICE

BACKGROUND OF THE INVENTION

1. Field of the Invention

The present invention relates to a substrate processing device used for manufacturing a semiconductor device, a liquid crystal display device, a solar battery, and the like, more particularly to a substrate processing device such as a CVD (chemical vapor deposition) device, an etching device, an ashing device, and a sputtering device.

2. Description of the Related Art

As the substrate used for a liquid crystal display device becomes larger, the size of substrate processing devices such as a CVD device, an etching device, an ashing device, and a sputtering device increases correspondingly. Therefore, in the case of a plasma processing device of a parallel plate type, for example, it is becoming more and more difficult to perform a uniform process for the entire surface of a substrate.

As a method for solving this problem, a substrate processing device that consecutively processes a substrate while conveying it through an elongated linear-shaped processing zone has been suggested as disclosed in Japanese Laid-Open Publication No. 8-279498. The substrate processing device having such an elongated linear-shaped processing zone is shown in FIG. 6.

As shown in FIG. 6, in a substrate processing device 600 having an elongated linear-shaped processing zone 10, a substrate holder 3 carrying a substrate 4 is conveyed through a vacuum chamber 1 by a conveyor mechanism 5 while the substrate 4 is heated by a heating section 2.

On the other hand, an excitation gas introduced from an excitation gas introduction nozzle 6 is excited by an RF electrode 8 through a dielectric window 16. Also, a reaction gas is introduced by a reaction gas introduction nozzle 7. The excitation gas and the reaction gas pass through the processing zone 10 so as to be discharged from a vacuum discharge outlet 9 positioned parallel to the processing zone 10. When the substrate 4 passes through the processing zone 10 containing the excitation gas and the reaction gas as the surface of the substrate 4 is consecutively processed.

However, in the substrate processing device 600 described above, when the substrate 4 and the substrate holder 3 pass through the processing zone 10, spatial changes occur within the processing zone 10 due to the substrate 4 and the substrate holder 3 taking respectively different positions as shown in FIGS. 7A through 7C. Accordingly, the direction and rate of the flow of the processing gas near the surface of the substrate 4 may vary correspondingly. This results in a problem in that that the substrate 4 may be subjected to non-uniform processing, for example.

Moreover, because the processing gas diffuses to areas other than the processing zone 10, reaction components may adhere to be deposited as dust on the inner walls, observation window, and the like of the vacuum chamber 1.

FIGS. 7A, 7B, and 7C, sequentially, illustrate how the substrate 4 is conveyed.

SUMMARY OF THE INVENTION

According to one aspect of this invention, a substrate processing device includes: a conveyor mechanism provided in a vacuum chamber for conveying a substrate thereon; a heating section provided within the vacuum chamber for heating the substrate; and a processing gas introduction section for introducing a processing gas to a processing zone within the vacuum chamber. A surface of the substrate is consecutively subjected to a predetermined process by: introducing a flow of the processing gas from the processing gas introduction section into the processing zone; conveying the substrate into and past the processing zone by means of the conveyor mechanism while heating the substrate by means of the heating section. The substrate processing device further includes an inert gas supplying section provided in the vacuum chamber for supplying an inert gas for controlling the flow of the processing gas.

In one embodiment of the invention, the inert gas supplying section includes a first inert gas supplying section for supplying a first inert gas for controlling the flow of the processing gas so as not to substantially escape from the processing zone.

In another embodiment of the invention, the first inert gas supplying section substantially surrounds the processing zone.

In still another embodiment of the invention, the substrate processing device further includes a separation wall provided in the vacuum chamber for separating the processing zone from a remainder of the space in the vacuum chamber, the separation wall surrounding the processing zone.

In still yet another embodiment of the invention, the inert gas supplying section is provided along at least one of the inside and the outside of the separation wall.

In still another embodiment of the invention, the inert gas supplying section is provided at a tip end of the separation wall.

In still another embodiment of the invention, the inert gas supplying section further includes a second inert gas supplying section for supplying a second inert gas for controlling the flow of the processing gas and the first inert gas so as to prevent turbulence of the flows of the first inert gas and the processing gas.

In still another embodiment of the invention, the second inert gas supplying section is provided ahead of and behind the substrate being conveyed by the conveyor mechanism.

In still another embodiment of the invention, the processing gas introduction section includes: an excitation gas introduction section for introducing an excitation gas; and a reaction gas introduction section for introducing a reaction gas. The processing gas introduced into the processing zone comprises a mixture of the excitation gas and the reaction gas.

In still another embodiment of the invention, the inert gas includes at least one element selected from the group comprising Ar, He and $N_2$.

A substrate processing device according to the present invention includes an inert gas supplying section, so that a flow of a processing gas is controlled by a flow of an inert gas supplied from inert gas supplying sections, thereby making it possible to prevent the processing gas from escaping from the processing zone while maintaining a substantially constant flow of the processing gas within the processing zone. Accordingly, it is possible to subject the entire surface of a substrate to uniform processing. In addition, it is possible to control dust deposition by preventing reaction components from adhering to inner walls of the vacuum chamber.

By disposing an inert gas supplying section so as to surround a processing zone, the introduced inert gas forms the curtain-like flow surrounding the processing zone. Accordingly, it is possible to prevent the processing gas from escaping from the processing zone while maintaining a substantially constant flow of the processing gas within the processing zone.

By providing a separation wall which surrounds the processing zone so as to separate the processing zone from the other spaces, the separation wall and the inert gas provide a synergetic effect. Accordingly, it is possible to prevent the processing gas from escaping from the processing zone while maintaining a substantially constant flow of the processing gas within the processing zone.

By providing an inert gas supplying section along the inside or outside of the separation wall, the separation wall and the curtain-like flow of the inert gas create a synergetic effect. Accordingly, it is possible to prevent the processing gas from escaping from the processing zone while maintaining a substantially constant flow of the processing gas within the processing zone.

By providing an inert gas supplying section at the tip end of the separation wall, it is possible to ensure that the curtain-like f low of the inert gas is formed along the extention of the plane of the separation wall. Accordingly, it is possible to prevent the processing gas from escaping from the processing zone while maintaining a substantially constant flow of the processing gas within the processing zone.

By providing inert gas supplying sections ahead of and behind the traveling substrate, it becomes possible to fill the spaces other than the processing zone with the inert gas, thereby preventing turbulence of the curtain-like flow of the inert gas and the flow of the processing gas.

Thus, the invention described herein makes possible the advantage of providing a substrate processing device which subjects a substrate to uniform processing by maintaining a flow of a processing gas in a predetermined direction and at a constant rate near the surface of the substrate, irrespective of any spatial changes occurring in the processing zone with the positioning of the substrate, and suppresses the deposition of dust particles by concentrating the processing gas into the processing zone.

This advantage of the present invention will become apparent to those skilled in the art upon reading and understanding the following detailed description with reference to the accompanying figures.

DESCRIPTION OF THE PREFERRED EXAMPLES

Hereinafter, the present invention will be described by way of examples with reference to FIGS. 1 through 5.

EXAMPLE 1

Figure 1:
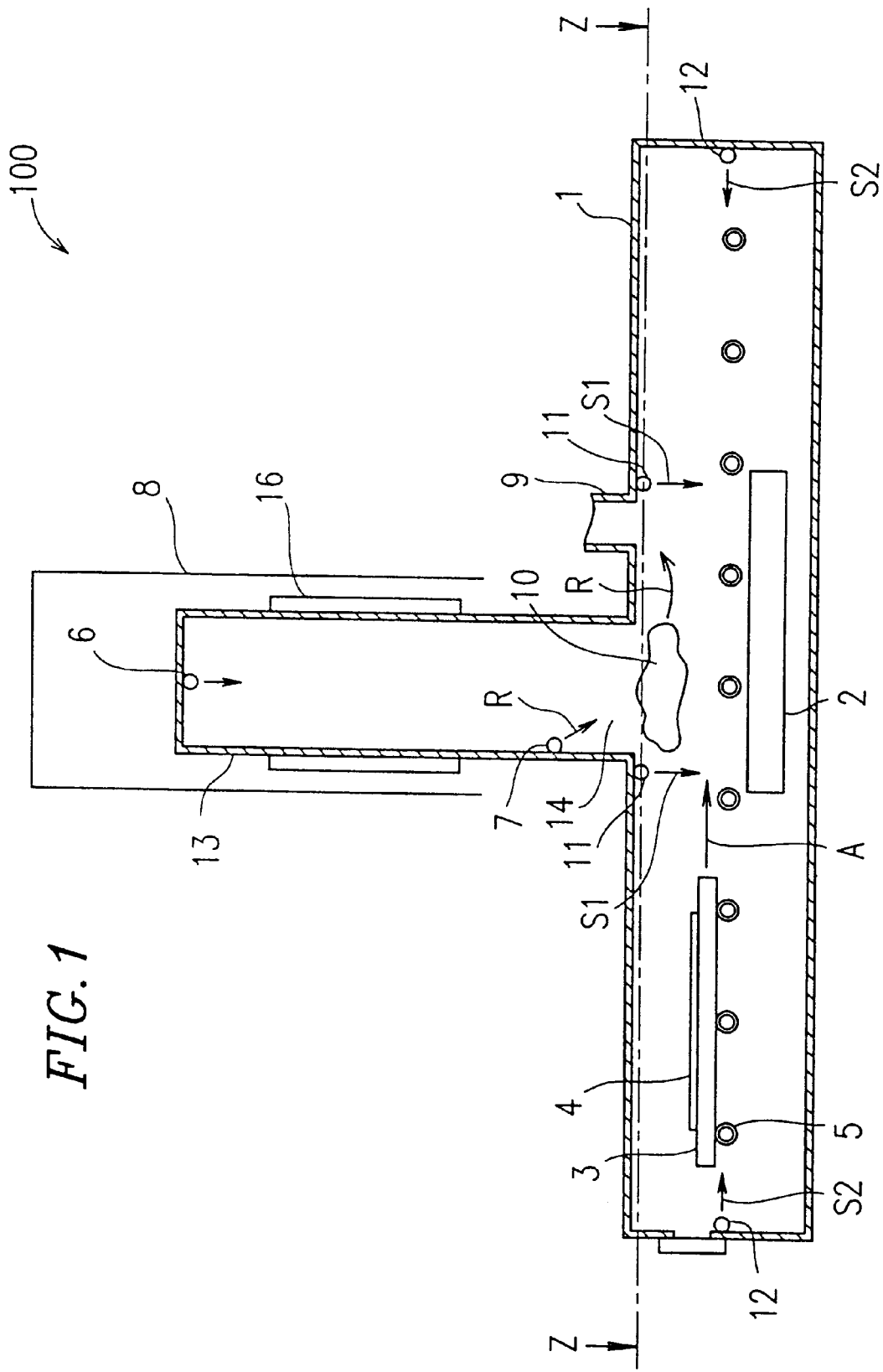
FIG. 1 shows a cross-sectional view of a substrate processing device according to Example 1 of the present invention.
Figure 2:
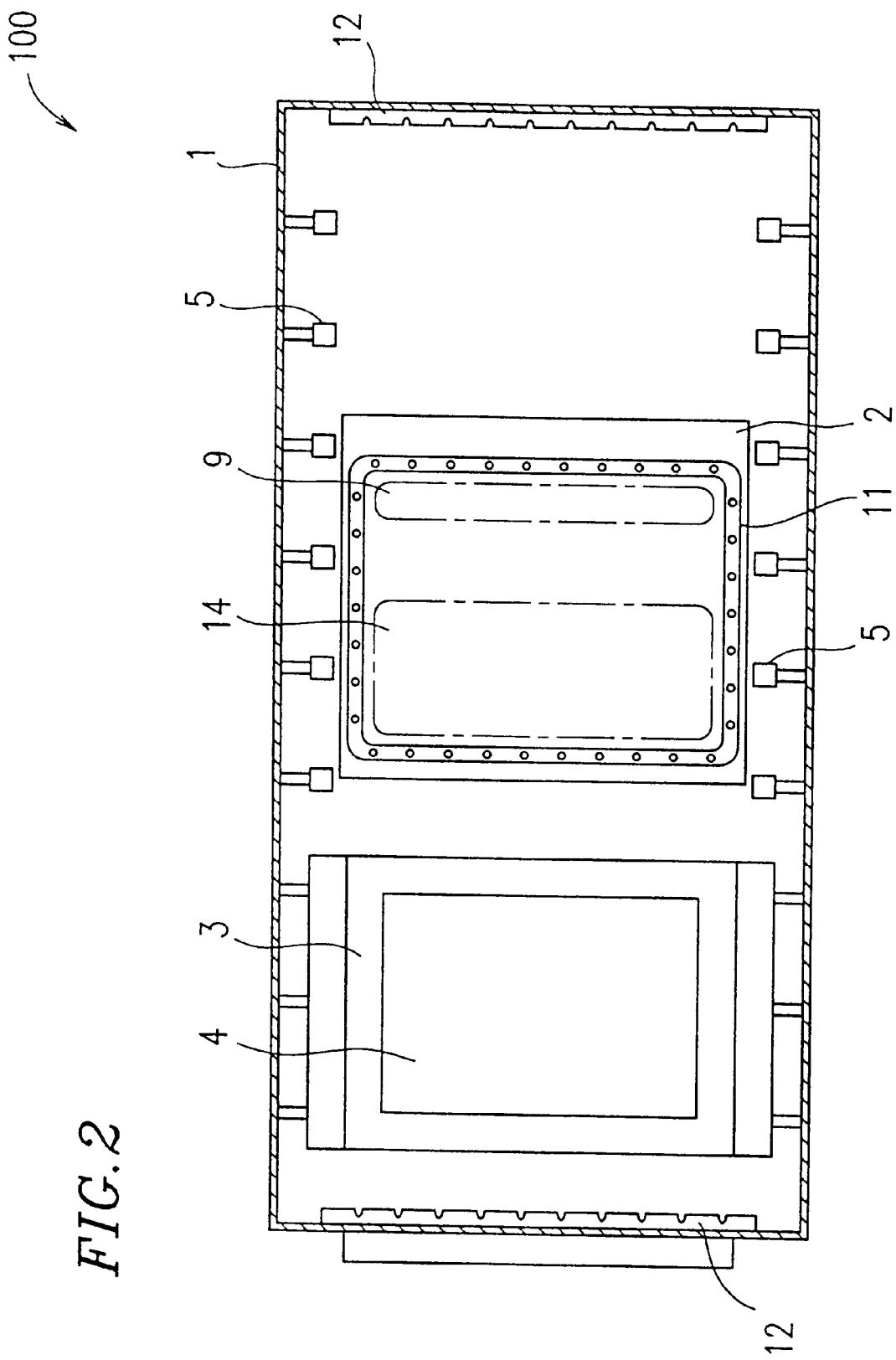
FIG. 2 shows a cross-sectional view taken along line Z—Z in FIG. 1.
Figure 3A:
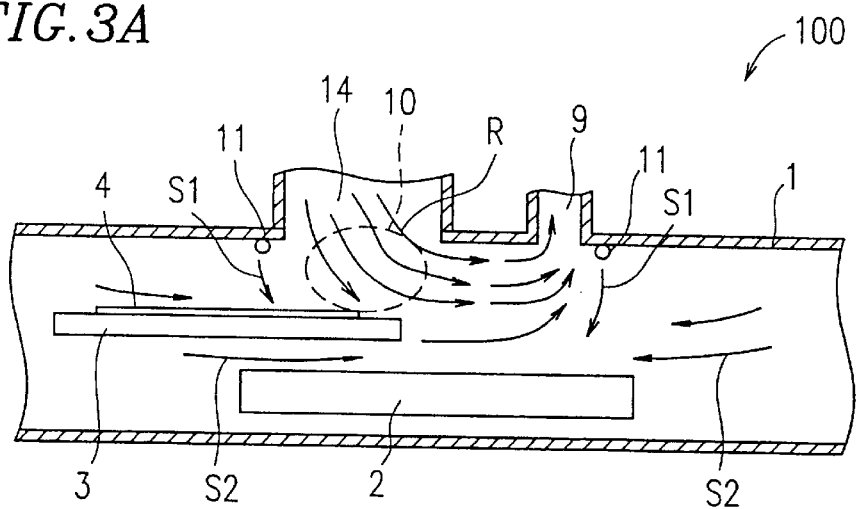
FIGS. 3A to 3C are schematic figures illustrating the flow of a processing gas in a substrate processing device according to Example 1 of the present invention.
Figure 3B:
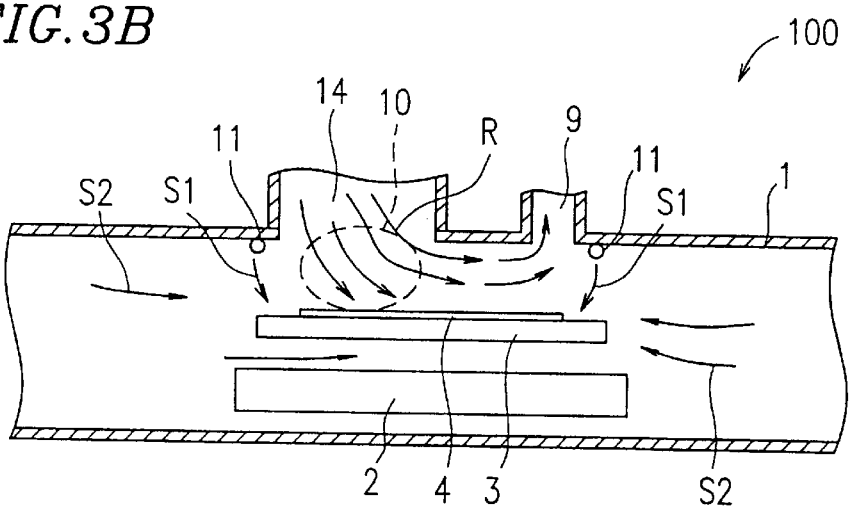
Figure 3C:
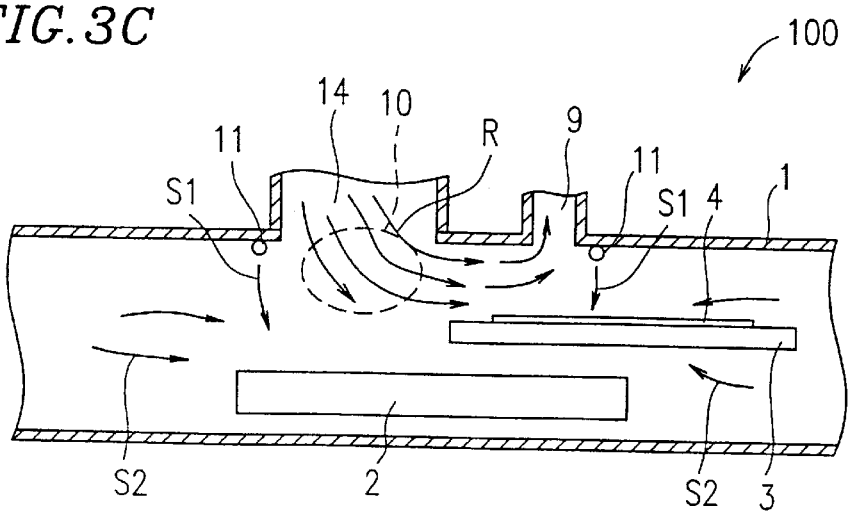

FIG. 1 illustrates a cross-sectional view of a substrate processing device 100 of Example 1 according to the present invention. FIG. 2 is a cross-sectional view taken along line Z—Z in FIG. 1. FIGS. 3A to 3C are schematic figures illustrating the flow of a processing gas in the substrate processing device 100.

As shown in FIGS. 1 and 2, in accordance with a substrate processing device 100 of the present example, a plasma chamber 13 for generating plasma is provided in an upper portion of a vacuum chamber 1 so as to extend substantially perpendicularly to the longitudinal direction of the vacuum chamber 1. Thus, the vacuum chamber 1 may be seen as consisting of two sections (i.e. , right-hand and left-hand sections) joined together where they meet the plasma chamber 13. The plasma chamber 13 has an elongated plasma chamber opening 14 in a lower portion thereof.

On the outside of the plasma chamber 13, an RF electrode 8 and a dielectric window 16, via which an electric field from the RF electrode 8 is led into the plasma chamber 13, are provided so as to be present on the right and left sides (as shown in FIG. 1 in this example)of the plasma chamber 13. On the inside of the plasma chamber 13, an excitation gas introduction nozzle 6 having a linear array of inlet holes for introducing an excitation gas is provided on the upper wall, and a reaction gas introduction nozzle 7 having a linear array of inlet holes for introducing a reaction gas is provided on the left side wall.

On the inner upper wall of the vacuum chamber 1, an elongated vacuum discharge outlet 9 is provided adjacent the plasma chamber opening 14 so as to extend parallel to the plasma chamber 13. Specifically, the elongated vacuum discharge outlet 9 is located on the inner upper wall of the section of the vacuum chamber 1 away from the reaction gas introduction nozzle 7 (i.e., the right-hand section in FIG. 1). In addition, on the inner upper wall of the vacuum chamber 1, a first inert gas introduction nozzle 11 is provided which has inlet holes arranged so as to surround or encircle the plasma chamber opening 14 and the vacuum discharge outlet 9. On each (i.e., right or left) of the inner side walls of the vacuum chamber 1, second inert gas introduction nozzles 12 having a linear array of inlet holes are provided. Thus, the first and second inert gas introduction nozzles 11 and 12 which are each composed of a porous pipe having an array of holes aligned with a predetermined pitch, are provided on the respective walls of the vacuum chamber 1. The inlet holes of the second inert gas introduction nozzles 12 are arranged in one or more rows. Multiple rows of the second inert gas introduction nozzles 12 may be suitably provided depending upon the inner height of the vacuum chamber 1. Alternatively, the first and second inert gas introduction nozzles 11 and 12, respectively, may be each defined by inlet holes which are formed directly on the walls of the chamber 1, for example.

Moreover, in the vacuum chamber 1, a substrate holder 3 carrying a substrate 4 is placed on a conveyor mechanism 5, and conveyed in the direction of arrow A (i.e., from left to right in FIG. 1) by the operation of the conveyor mechanism 5. Moreover, a heating section 2 is placed below the conveyor mechanism 5. The longitudinal dimension of the heating section 2 is equal to or greater than the distance from the plasma chamber opening 14 to the vacuum discharge outlet 9. In the alternative or in addition, the substrate holder 3 may include a resistor-based heating section. The conveyor mechanism 5 may have any structure, e.g., a roller or a rack-and-pinion mechanism.

Next, a gas flow will be described with reference to FIGS. 3A through 3C. The excitation gas introduced from the excitation gas introduction nozzle 6 is excited by the RF electrode 8 through the dielectric window 16. It is then mixed with the reaction gas introduced from the reaction gas introduction nozzle 7. The mixed gases, herein referred to as a processing gas R, are led through the plasma chamber opening 14 so as to be discharged from a vacuum discharge outlet 9.

On the other hand, a first inert gas S1 is introduced from a first inert gas introduction nozzle 11. By a curtain-like flow of the first inert gas S1, the processing gas R is substantially confined within the bounds of the first inert gas S1, which defines a processing zone 10.

In addition, linear flows of a second inert gas S2 are introduced from the second inert gas introduction nozzles 12 so as to fill in right-hand and the left-hand spaces within the vacuum chamber 1. The second inert gas S2 is controlled so that the curtain-like flow of the first inert gas S1 and the flow of processing gas R are not disturbed.

FIGS. 3A through 3C sequentially show how the substrate 4 is conveyed.

As shown, the substrate 4 carried on the substrate holder 3 is conveyed in the direction of arrow A by the conveyor mechanism 5 while being heated to a desired temperature by the heating section 2, and passes through the processing zone 10 filled with processing gas R therein. The processing gas R undergoes a vapor-phase reaction, in the vicinity of the surface of the substrate 4, which is heated to the desired temperature. As a result, the surface of the substrate 4 is consecutively processed. The vapor-phase reaction provides a deposition, etching, or ashing effect on the surface of the substrate 4, as determined by the specific types of gases employed.

The first and second inert gases S1 and S2, may be Ar, He or $N_2$, for example, as required by the type of process to which the substrate 4 is subjected. The first and second inert gases S1 and S2 may be the same or different inert gases.

EXAMPLE 2

Figure 4:
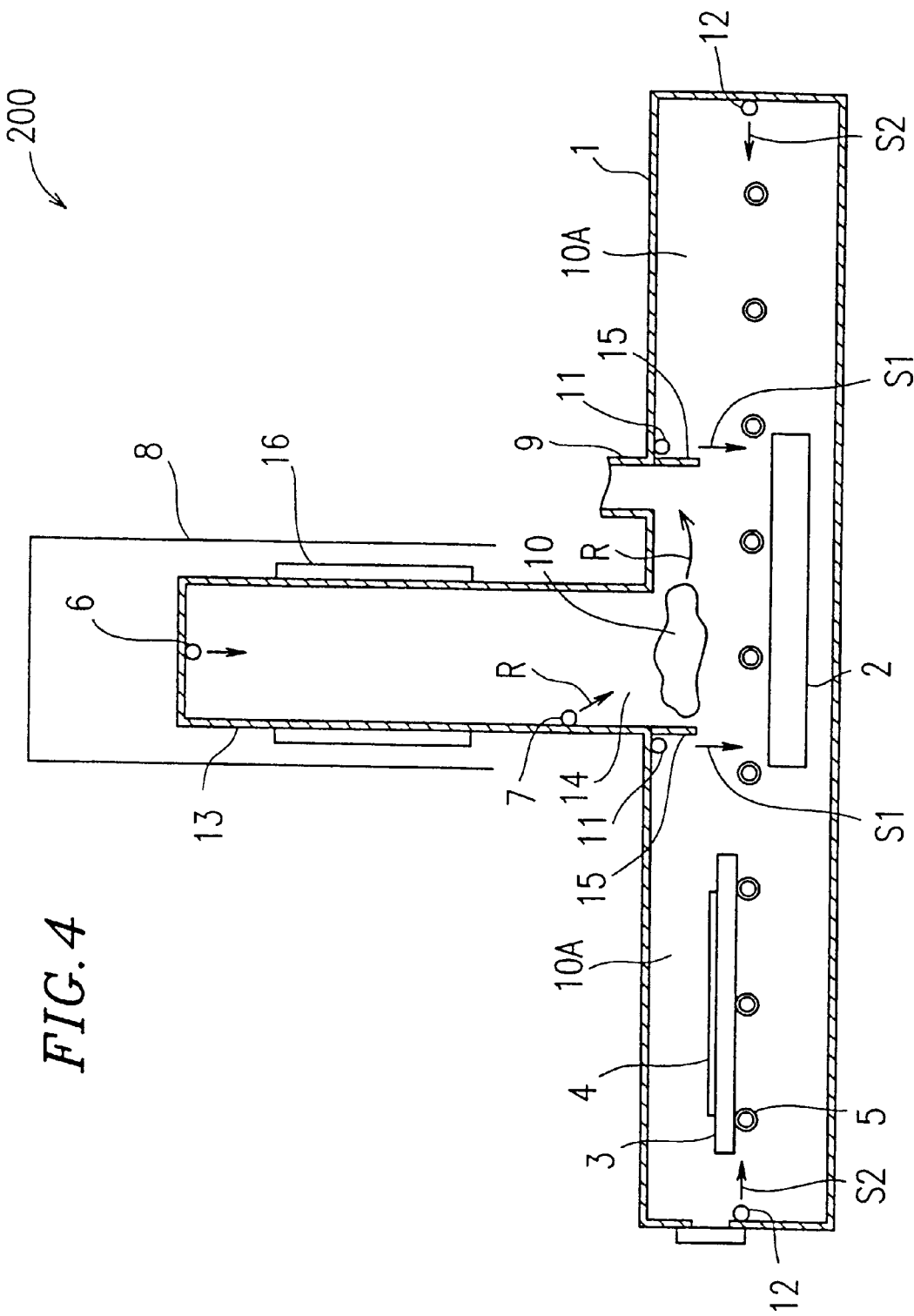
FIG. 4 is a cross-sectional view of a substrate processing device according to Example 2 of the present invention.

FIG. 4 shows a cross-sectional view of a substrate processing device 200 of Example 2 according to the present invention. The structure of the substrate processing device 200 of Example 2 of the present invention is substantially the same as that of the substrate processing device 100 of Example 1 except for the features described below.

As shown in FIG. 4, in accordance with the substrate processing device 200 of the present example, a processing zone separation wall 15, which spatially separates the processing zone 10 from the remaining zone 10A, is disposed on the inner upper wall of the vacuum chamber 1 so as to surround or enclose the plasma chamber opening 14 and the vacuum discharge outlet 9. The processing zone separation wall 15 prevents the flow of the processing gas R from being perturbed and mixed up by the first inert gas so as to be diffused in the vicinity of the inner upper wall of the vacuum chamber 1.

On the outside of the processing zone separation wall 15 is provided a first inert gas introduction nozzle 11, having an array of inlet holes, the inlet holes being aligned along the processing zone separation wall 15. A first inert gas S1 introduced from the first inert gas introduction nozzle 11 forms a curtain-like gas flow along the processing zone separation wall 15, so that the processing gas R is controlled so as not to flow out from the processing zone 10.

Alternatively, the first inert gas introduction nozzle 11 may be provided inside the processing zone separation wall 15.

As described above, the processing zone separation wall 15 and the curtain-like gas flow of the first inert gas S1 along the processing zone separation wall 15 provide a synergetic effect to further prevent the processing gas R from escaping from the processing zone 10, while maintaining a substantially constant flow of the processing gas R within the processing zone 10.

EXAMPLE 3

Figure 5:
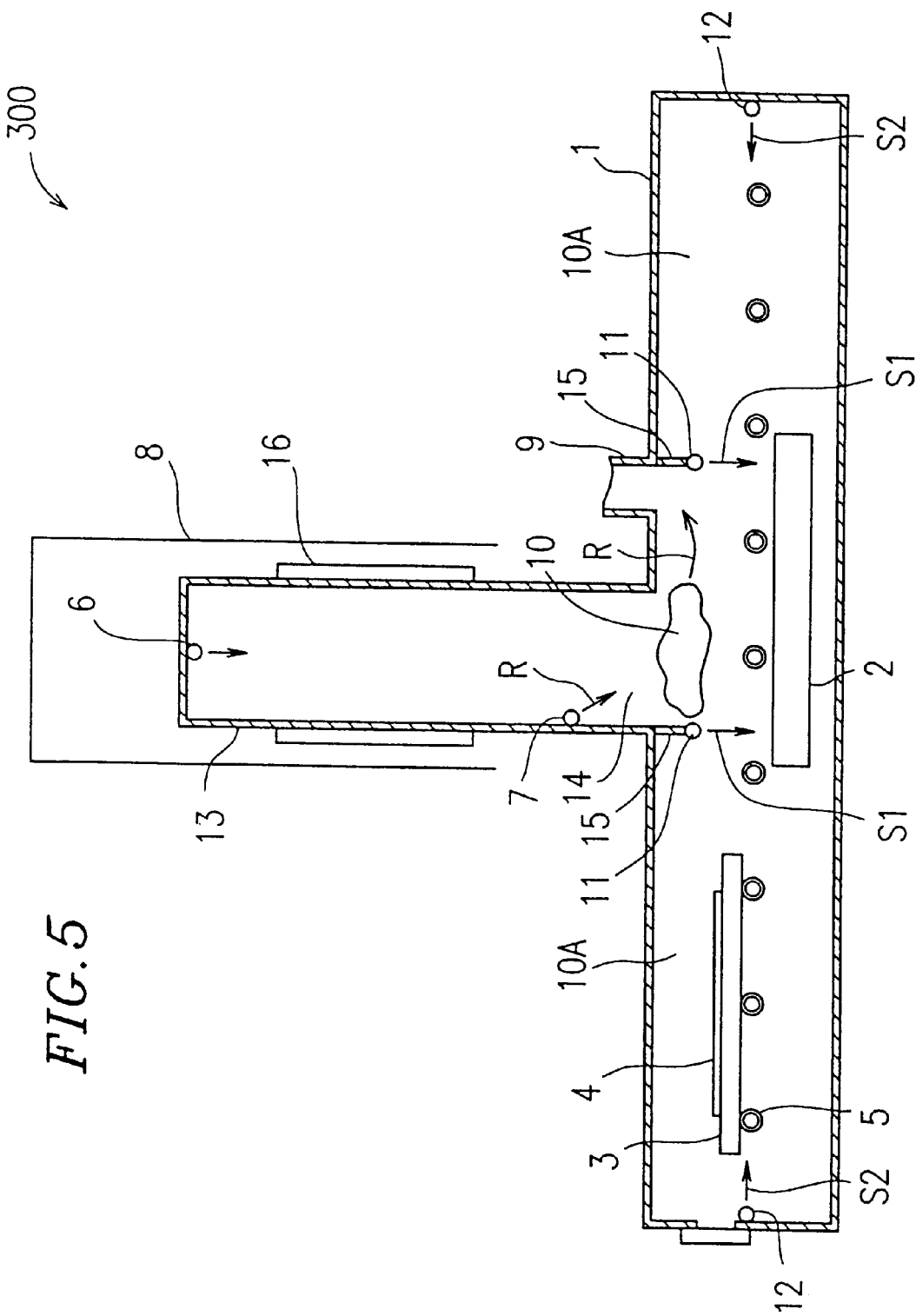
FIG. 5 is a cross-sectional view of a substrate processing device according to Example 3 of the present invention.
Figure 6:
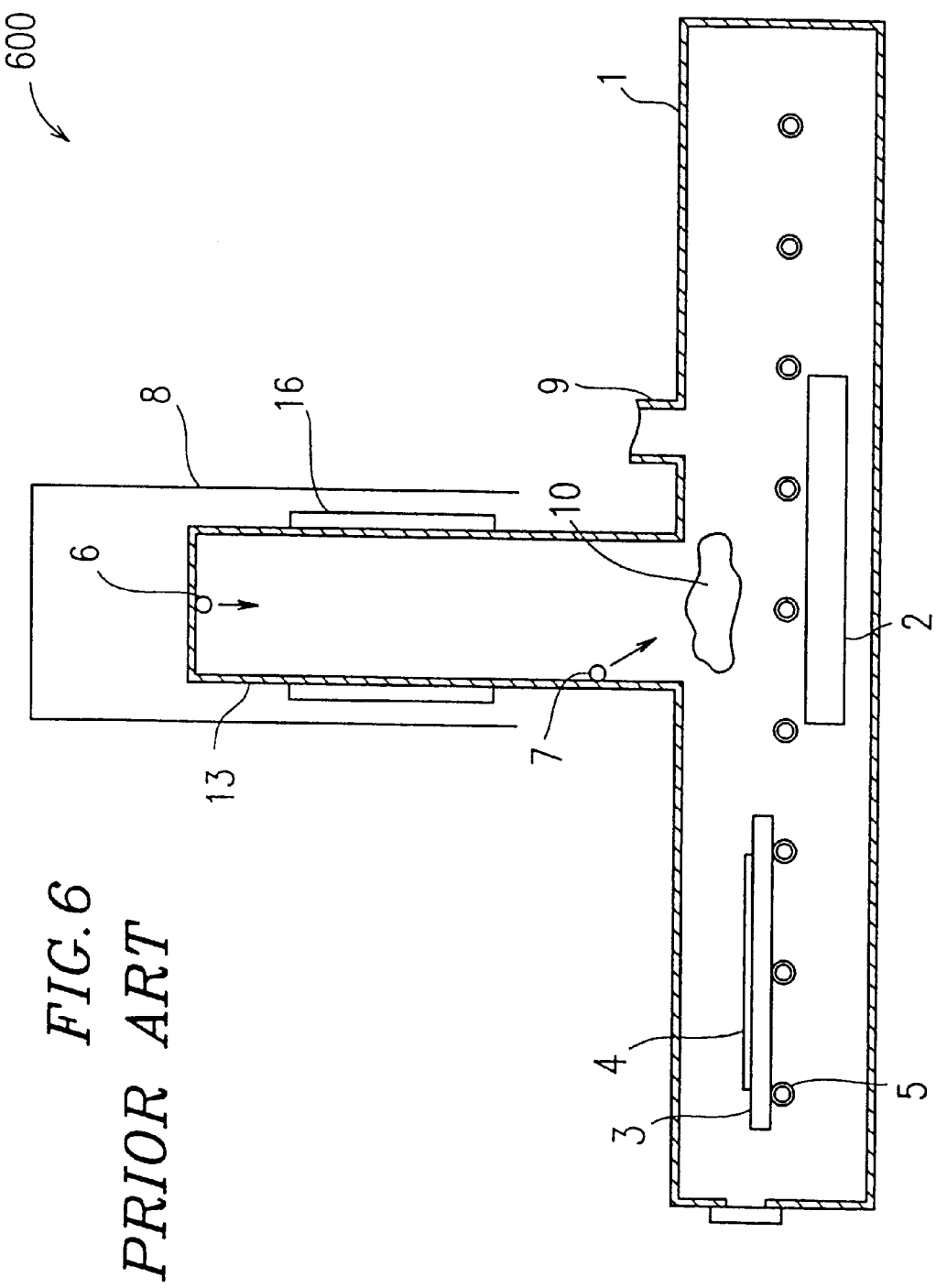
FIG. 6 is a cross-sectional view of a conventional substrate processing device.
Figure 7A:
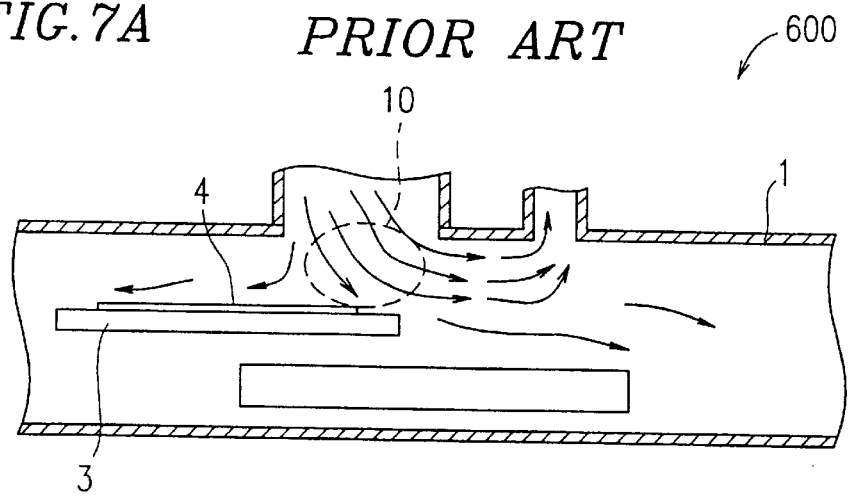
FIGS. 7A to 7C are schematic figures illustrating the flow of a processing gas in the conventional substrate processing device.
Figure 7B:
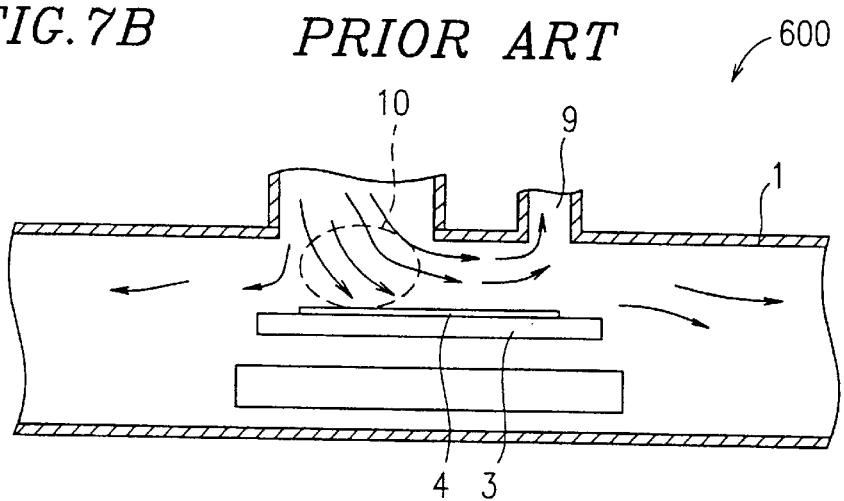
Figure 7C:
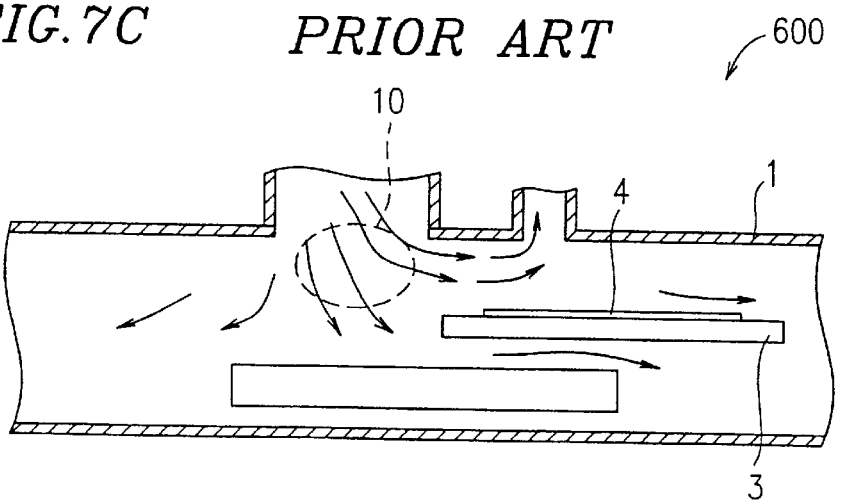

FIG. 5 shows a cross-sectional view of a substrate processing device 300 of Example 3 according to the present invention. The structure of the substrate processing device 300 is substantially the same as that of the substrate processing device 100 of Example 1 except for the features described below.

As shown in FIG. 5, in accordance with the substrate processing device 300 of Example 3, aprocessing zone separation wall 15, which spatially separates the processing zone 10 from the remaining zone 10A, is disposed on the inner upper wall of the vacuum chamber 1 so as to surround or enclose the plasma chamber opening 14 and the vacuum discharge outlet 9. The processing zone separation wall 15 prevents the flow of the processing gas R from being perturbed and mixed up by the first inert gas so as to be diffused in the vicinity of the inner upper wall of the vacuum chamber 1.

A first inert gas introduction nozzle 11, having introduction holes located at a tip end of the processing zone separation wall 15, is disposed on the processing zone separation wall 15. A first inert gas S1 introduced from the first inert gas introduction nozzle 11 forms a curtain-like gas flow emanating from the tip end of the processing zone separation wall 15, so that the processing gas R is controlled so as not to flow out from the processing zone 10.

As described above, the processing zone separation wall 15 and the curtain-like gas flow of the first inert gas S1, which emanates from the tip end of the processing zone separation wall 15, and forms a curtain-like flow along the extention of the plane of the wall 15, provide a synergetic effect. As a result, the escape of the processing gas R from the processing zone 10 can be further prevented while being able to maintain a substantially constant flow of the processing gas R in the processing zone 10.

As described above, the substrate processing device according to the present invention includes inert gas supplying sections (such as a first inert gas introduction section 11 and a second inert gas introduction section 12), so that the flow of aprocessing gas R is controlled by the flow of an inert gas S1, S2 supplied from the inert gas supplying sections 11, 12 thereby making it possible to subject the entire surface of a relatively large substrate 4 to uniform processing. In addition, it is possible to control dust deposition by preventing reaction components from adhering to inner walls of the vacuum chamber 1. Moreover, the processing conditions according to the present invention are highly reproducible.

By disposing an inert gas supplying section 11, 12 so as to surround a processing zone 10, the introduced inert gas S1, S2 forms a curtain-like flow surrounding the processing zone 10. As a result, it becomes possible to subject the entire surface of a relatively large substrate 4 to uniform processing. In addition, it is possible to control dust deposition by preventing reaction components from adhering to inner walls of the vacuum chamber 1. Moreover, the processing conditions according to the present invention are highly reproducible.

By providing a separation wall 15 which surrounds the processing 10 zone so as to separate the processing zone from the other spaces 10A, the separation wall 15 and the inert gas S11, S12 provide a synergetic effect. As a result, it becomes possible to subject the entire surface of a relatively large substrate 4 to uniform processing. In addition, it is possible to control dust deposition by preventing reaction components from adhering to inner walls of the vacuum chamber 1. Moreover, the processing conditions according to the present invention are highly reproducible.

By providing an inert gas supplying section along the inside or outside of the separation wall 15, the separation wall 15 and the curtain-like flow of the inert gas create a synergetic effect. As a result, it becomes possible to subject the entire surface of a relatively large substrate 4 to uniform processing. In addition, it is possible to control dust deposition by preventing reaction components from adhering to inner walls of the vacuum chamber 1. Moreover, the processing conditions according to the present invention are highly reproducible.

By providing an inert gas supplying section 11 at the tip end of the separation wall 15, it is possible to ensure that the curtain-like flow of the inert gas S1 forms a curtain-like flow along the extension of the plane of the separation wall 15. As a result, it becomes possible to subject the entire surface of a relatively large substrate 4 to uniform processing. In addition, it is possible to control dust deposition by preventing reaction components from adhering to inner walls of the vacuum chamber 1. Moreover, the processing conditions according to the present invention are highly reproducible.

By providing an inert gas supplying sections 12 ahead of and behind the traveling substrate 4, it becomes possible to fill the spaces other than the processing zone 10A with the inert gas S2, thereby preventing turbulence of the curtain-like flow of the inert gas S1 and the flow of the processing gas R. As a result, it becomes possible to subject the entire surface of a relatively large substrate 4 to uniform processing. In addition, it is possible to control dust deposition by preventing reaction components from adhering to inner walls of the vacuum chamber 1. Moreover, the processing conditions according to the present invention are highly reproducible.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A substrate processing device, comprising:
   a conveyor mechanism provided in a vacuum chamber for conveying a substrate thereon;
   a heating section provided within the vacuum chamber for heating the substrate; and
   a processing gas introduction section for introducing a processing gas to a processing zone within the vacuum chamber; wherein
   a surface of the substrate is consecutively subjected to a predetermined process by: introducing a flow of the processing gas from the processing gas introduction section into the processing zone; and conveying the substrate into and past the processing section by means of the conveyor mechanism while heating the substrate by means of the heating section, and wherein the substrate processing device further comprises:
   an inert gas supplying section provided in the vacuum chamber for supplying an inert gas for controlling the flow of the process gas, wherein the inert gas supplying section comprises a first inert supplying section, which substantially surrounds the processing zone and is approximately perpendicular to the substrate being conveyed by the conveyor mechanism, and a second inert gas supplying section, which is provided ahead of and behind, and is approximately parallel to the substrate being conveyed by the conveyor mechanism.

2. A substrate processing device according to claim 1, wherein the first inert gas supplying section supplies a first inert gas for controlling the flow of the processing gas so as not to substantially escape from the processing zone.

3. A substrate processing device according to claim 2, wherein the second inert gas supplying section supplies a second inert gas for controlling the flow of the processing gas and the first inert gas so as to prevent turbulence of the flows of the first inert gas and the processing gas.

4. A substrate processing device according to claim 1, further comprising a separation wall provided in the vacuum chamber for separating the processing zone from a remainder of the space in the vacuum chamber, the separation wall surrounding the processing zone.

5. A substrate processing device according to claim 4, wherein the inert gas supplying section is provided along at least one of the inside and the outside of the separation wall.

6. A substrate processing device according to claim 4, wherein the inert gas supplying section is provided at a tip end of the separation wall.

7. A substrate processing device according to claim 1, wherein the processing gas introduction section comprises:
   an excitation gas introduction section for introducing an excitation gas; and
   a reaction gas introduction section for introducing a reaction gas, and wherein
   the processing gas introduced into the processing zone comprises a mixture of the excitation gas and the reaction gas.

8. A substrate processing device according to claim 1, wherein the inert gas includes at least one element selected from the group comprising Ar, He and $N_2$.

* * * * *